US006856265B2

(12) United States Patent
Kuo et al.

(10) Patent No.: US 6,856,265 B2
(45) Date of Patent: Feb. 15, 2005

(54) DATA CONVERTER WITH BACKGROUND AUTO-ZEROING VIA ACTIVE INTERPOLATION

(75) Inventors: Tai-Haur Kuo, Hsin-Tien (TW); Kuo-Hsin Chen, Hsin-Tien (TW); Jyh-Fong Lin, Hsin-Tien (TW); Hsin-Chieh Lin, Hsin-Tien (TW)

(73) Assignee: VIA Technologies Inc., Hsin-Tien (TW)

( * ) Notice: Subject to any disclaimer, the term of this patent is extended or adjusted under 35 U.S.C. 154(b) by 0 days.

(21) Appl. No.: 10/604,527

(22) Filed: Jul. 29, 2003

(65) Prior Publication Data

US 2004/0135715 A1 Jul. 15, 2004

Related U.S. Application Data

(63) Continuation-in-part of application No. 10/063,204, filed on Mar. 28, 2002, now Pat. No. 6,642,866.

(51) Int. Cl.$^7$ ............................................. H03M 3/00
(52) U.S. Cl. ....................................... 341/118; 341/120
(58) Field of Search ................................... 341/118, 120

(56) References Cited

U.S. PATENT DOCUMENTS 6,642,866 B2 * 11/2003 Kuo et al. .................. 341/118

* cited by examiner

*Primary Examiner*—Brian Young
*Assistant Examiner*—Joseph Lauture
(74) *Attorney, Agent, or Firm*—Winston Hsu

(57) ABSTRACT

An analog-to-digital data converter converts an input signal to corresponding digital signals. The data converter includes two sets of comparison units arranged in an interlaced sense to alternatively analyze the input signal, generate digital signals corresponding to the result of comparing the input signal and reference signals. Each of the comparison units has a positive output and a negative output, and the digital signal is generated by the negative output and the positive output of the comparison units in a differential way. When the comparison units of one set are performing auto-zeroing, the comparison units of the other set perform the data conversion to generate corresponding digital signals.

13 Claims, 14 Drawing Sheets

US 6,856,265 B2

DATA CONVERTER WITH BACKGROUND AUTO-ZEROING VIA ACTIVE INTERPOLATION

CROSS REFERENCE TO RELATED APPLICATIONS

The following is a continuation-in-part of application Ser. No. 10/063,204, filed Mar. 28, 2002 which is now U.S. Pat. No. 6,642,866.

BACKGROUND OF INVENTION

1. Field of the Invention

The present invention relates to a data converter, and more particularly, an analog to digital data converter using active interpolation to realize background auto-zeroing.

2. Description of the Prior Art

Using digital signals for information transmitting, processing and storing is an important foundation of the information industry. A digital signal is basically composed of a high state and a low state, so the digital signal has a high noise tolerance. In addition, the digital signals can be processed in a modular design. Therefore, circuits for transmitting, processing, and storing digital signals are key issues in the information industry.

All signals are essentially analog signals that vary continuously, such as human voices, natural light, and so on. A data converter, which can convert analog data to digital, is needed for processing analog signals into digital form. Digital signals are really continuous analog signals. In a digital signal, while the waveform of the signal varies, for instance from a high state to a low state, a transient state exists. The transient state comprises a rising edge and a falling edge. Thus, the waveform of the digital signal is not a perfect square wave. Digital signals are less ideal when the digital signals are frequently switched between different states. For processing the non-ideal digital signals, an analog to digital data converter is needed to obtain digital signals with more ideal characteristics. For this purpose, data converters must operate rapidly and continuously to obtain high frequency digital signals in real time.

Please refer to FIG. 1 of a schematic diagram of a prior art data converter 10, which is used to convert an analog input signal Vin to a corresponding digital signal. The data converter 10 comprises a voltage dividing circuit 12, an encoding circuit 16, and a plurality of comparison units 14. In FIG. 1, eight comparison units are shown by way of example. The voltage dividing circuit 12 comprises a plurality of resistors such as Ra, Rb, and Rc for dividing a voltage Vdc into different reference voltages Vr1 to Vr8 respectively at each node. Each of the comparison units 14 comprises an amplifier 18 and a latch circuit 19. The amplifier 18 receives the reference voltage generated by the voltage dividing circuit 12, and an input signal Via for amplifying the difference between these two input signals to generate a corresponding signal to the latch circuit 19. The latch circuit 19 is triggered by a clock vclock to convert the output signal of the amplifier 18 to a digital signal in a high or low state. This converted digital signal is output to the encoding circuit 16. The encoding circuit 16 processes (for example, corrects) and encodes the digital signals generated by the comparison units 14.

Please refer to FIG. 2 of a timing diagram of the clock vclock, the input signals Vin, and the output digital signals of each comparison unit while the prior art data converter 10 operates. The transverse axis in FIG. 2 is time. When the analog input signal Vin reaches the data converter 10. the amplifier 18 compares the input signal Vin with the corresponding reference voltage and outputs a comparison result to the latch circuit 19. According to the comparison result and a trigger of the clock vclock, the latch circuit 19 outputs a digital signal in a high state, which is shown by 1, or a low state, which is shown by 0. For example, at time t1, if the input signal yin is less than the reference voltages Vr1 and Vr2 but more than the reference voltages Vr3 to Vr8, then the latch circuit 19 is triggered by the negative edge of the clock vclock (which is shown by arrows) and outputs digital signals as 0, 0, 1, 1, 1, 1, 1, and 1. In this manner, the input signal Via at time t1 can be converted to a digital signal (0, 0, 1, 1, 1, 1, 1, 1). The encoding circuit 16 can encode the digital signal in advance, such as 011.

For the purpose of converting input analog signals to digital signals correctly, each amplifier must respond to the relationship between the input signal Vin and the reference voltage correctly. In a real circuit, each comparison unit generates an offset voltage due to the non-ideal characteristics of the device. This means the comparison unit adds the offset voltage to the input signal Vin and then compares the modified input signal Vin with the reference voltage. Thus, the comparison is not performed in an ideal operation situation. Additionally, if each comparison unit has different offset voltages, the data converter 10 is affected, and converts signals incorrectly.

To adjust for the offset voltage in the comparison units, an auto-zeroing process is used to solve the problem. Please refer to FIG. 3 of a schematic diagram of a data converter 20 in the prior art. The data convener comprises a voltage dividing circuit 22 for providing reference voltages Vr1 to Vr4, four comparison units 24A to 24D, auxiliary circuits 26A and 26B, and an encoding circuit 28. The comparison units 24A to 24D have the same structure. The comparison unit 24A comprises four switches SP1, SP2, SP3 and SP4, a differential amplifier Ka with one output end and two input ends, a capacitor C0, and a latch circuit Ja. The switches SP1 to SF4 are controlled by a control signal Vc1 and an inverted signal of the control signal vc1 shown as $\overline{vc1}$ The amplifier Ka comprises a feedback circuit controlled by the switch SP3 electrically connected to the input end P11 and the output end P12. The other input end of the amplifier Ka is electrically connected to a common mode voltage V0. The latch circuit Ja is triggered by the clock vclock. Each comparison unit is electrically connected to a resistor Rc.

The data converter 20 operates as follows. The amplifier compares the input signal Vin with the reference voltage and outputs the comparison result to the latch circuit. The latch circuit is then triggered by the clock vclock to generate a digital signal. To compensate for the offset voltage generated in the amplifiers, the switches in each comparison unit conduct or open to allow each comparison unit to perform a comparing process or, alternatively, an auto-zeroing process. The comparison unit 24C shown in FIG. 3 is in the auto-zeroing process. Please notice that the switches in the comparison unit 24C can conduct the feedback circuit of the amplifier Kc, and the capacitor can be also electrically connected to a corresponding reference voltage Vr3. At this time, the reference voltage Vr3 charges the capacitor C0 via the switch SP2 in the comparison unit 24C. When the feedback circuit conducts, a closed loop is formed at the node P31 so that the amplifier Kc is virtually grounded to the common mode voltage V0. Thus, the charge amount in the capacitor C0 is dependent on the reference voltage Vr3. The charge amount is enough to compensate for the offset voltage of the amplifier Kc, and the goal of auto-zeroing is achieved.

After the auto-zeroing process, each comparison unit switches to a comparing process and compares the input signal with the reference voltage. Then, a corresponding digital signal is output from the latch circuit. For example, the comparison unit 24A shown in FIG. 3 is performing a comparison process. Please notice that the switch SP3 is opened so that the feedback circuit does not conduct and place the amplifier Ka in an open loop. The signal Vin is input to the capacitor C0 via the switch SP1 so that voltages on both terminals of the capacitor C0 are modified. Since the charge amount of the capacitor C0 in the auto-zeroing process corresponds to the reference voltage, the voltage on node P11 corresponds to a comparison result between the input signal Vin and the reference voltage. This comparison result is sent to node P12 by the amplifier Ka. Finally, the comparison result is output to the latch circuit Ja via the switch SP4 and converted to a digital signal according to the trigger of the clock vclock. Thus, the purpose of comparing the input signal Vin and the reference voltage, and converting the input signal Vin, is achieved.

Next, please refer to FIG. 4 of a timing diagram of the control signals vc1 to vc4 and the clock vclock in the comparison units of the data converter 20. The transverse axis in FIG. 4 is time. Among the control signals vc1 to vc4, the signals in the high state control corresponding switches to conduct, and the signals in the low state control corresponding switches to open. The negative edge of the clock vclock triggers the latch circuit to latch digital signals. At time T2, the control signal vc3, which is in the high state, controls all switches in the comparison unit 24C to keep the comparison unit 24C in an auto-zeroing process during period Tz. At this time, the control signals vc1, vc2 and vc4, which are in the low state, keep the comparison units 24A, 24B, and 24D in the comparing processes respectively. Thus, the input signal Vin is compared with the reference voltage in each comparison unit and converted to a digital signal.

At time t2, the data converter 20 has only three comparison units performing the comparing process. The comparison unit 24C performs the auto-zeroing process and therefore no comparison result is available. However, the comparison unit 24B is electrically connected to the comparison unit 24D via the resistor Rc. A comparison result for the comparison unit 24C in the auto-zeroing process is generated by an interpolation method. The theory of the interpolation method is illustrated in FIG. 5 of a schematic diagram of converting curves of amplifiers K1 in the comparison units 24B to 24D. The transverse axis in FIG. 5 is the input voltage of the amplifier K1 that is differentially input. The longitudinal axis is the output voltage of the amplifier K1. The converting curves TP2 to TP4 correspond to the amplifier in the comparison units 24B to 24D respectively. The voltage Vk is a standard voltage for a latch circuit K2 to output a high or low digital signal. That means if the output voltage of the amplifier is higher or lower than the standard voltage Vk, the corresponding latch circuit generates a digital signal in a high or low state.

As shown in FIG. 3, when the comparison unit 24C is in the auto-zeroing process, the input of the latch circuit Jc, which is the voltage at the node P33, is dependent on the outputs of the amplifier Kb and Kd. When the comparison unit 24C performs the auto-zeroing process, the voltage of the comparison unit 24C is the interpolated value of the output voltages of the amplifiers Kb and Kd. Thus, the voltage characteristic at node P33 is an average of the converting curves TP2 and TP4 along the longitudinal axis in FIG. 5. Using the average of the converting curves TP2 and TP4 to obtain another converting curve TP3z is shown by arrow 27. If the converting curves TP2 and TP4 of the amplifiers Kb and Kd are both approximately linear and the reference voltage Vr3 is designated as an average value of the reference voltages Vr2 and Vr4, the average converting curve TP3z intersects the output voltage Vk on the longitudinal axis at the reference voltage Vr3 on the transverse axis.

As described above, when the comparison unit 24C performs the auto-zeroing process, the converting curve TP3 of the amplifier Kc is replaced by the converting curve TP3z that is obtained from the amplifiers Kb and Kd. The converting curve TP3z is not equal to the converting curve TP3. However, if the converting curve TP3z and the voltage Vk on the longitudinal axis intersect at the reference voltage Vr3 on the transverse axis, the converting curve TP3z at the node P33 can drive the latch circuit Jc. That means if the voltage at the node P33 is higher or lower than the standard voltage Vk, the corresponding latch circuit generates a digital signal in a high or low state respectively. Although the comparison unit 24C in the auto-zeroing process does not compare the input signal Vin with the reference voltage at the same time, a comparison result can be obtained by the interpolation of the adjacent comparison units.

As shown in FIG. 4, the data converter 20 has only one comparison unit in the auto-zeroing process at any time. The two adjacent comparison units, via the resistor network that is composed of the resistor Rc, interpolate the comparison result of the comparison unit in the auto-zeroing process. If the comparison unit 24A or 24D perform the auto-zeroing process, the comparison result is interpolated by the auxiliary circuits 26A or 26B and the comparison unit 24B or 24C.

While the data converter 20 converts analog signals to digital signals, each comparison unit performs the auto-zeroing process in turn. While one comparison unit is in the auto-zeroing process, its comparison result comes from other comparison units by an interpolating method via the resistor network, so that the data converter 20 operates with full functionality. However, a transient effect happens while the resistor network interacts with the capacitors in the data converter 20. When the comparison units generate a replacement comparison result via the resistor network, signals are delayed due to the RC constant so that the input bandwidth of the conventional data converter 20 is limited. The resistor network of the resistor Rc also increases the complexity and costs of circuit design and manufacture.

Additionally, the converting curve of each amplifier must have a large linear range so that the converting curve can be interpolated correctly. As shown in FIG. 5, the converting curve TP2 and TP4 near the reference voltage Vr3 had better be linear so that the converting curve TP3z, which intersects with the voltage Vk at the reference voltage Vr3, can be averaged correctly. If the converting curves TP2 and TP4 near the reference voltage Vr3 are not linear, the curve TP3z will incorrectly replace the converting curve TP3. As known, the above paragraph is suitable for some special cases, for example, 2X interpolation. In other cases, the amplifier need not be linear near Vr3. The accuracy of the interpolated Vr3 depends on the odd symmetry of the I/O characteristics of the amplifier. The comparison units also perform the auto-zeroing process one by one, and thus different control signals for each comparison unit are required. For instance, four control signals are required for the four comparison units shown in FIG. 4. The resulting circuit design is complicated.

SUMMARY OF INVENTION

It is therefore a primary objective of the claimed invention to provide a data converter with background auto-zeroing via an active interpolation to solve the above-mentioned problem.

According to the claimed invention, the data converter comprises two sets of comparison units arranged in an interlaced manner to alternatively accept the input signal to generate digital signals corresponding to the result of comparing the input and reference signals. The digital signal is generated by the comparison units in a differential way. When the comparison units of one set are performing auto-zeroing, the comparison units of the other set perform the data conversion to generate corresponding digital signals. The digital signals of the comparison unit of the set undergoing auto-zeroing are generated in active interpolation based on the digital signals from the comparison units of the other set undergoing the data converting process.

It is an advantage of the claimed invention that the comparison units of one set are performing auto-zeroing, and the comparison units of the other set perform the data conversion to generate corresponding digital signals simultaneously. In addition, the active interpolation in the claimed invention simplifies the circuit layouts so that the design and manufacturing time and costs are reduced. Moreover, result achieved by the active interpolation in the claimed invention is less sensitive to the non-linear characteristic of the converting curves.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
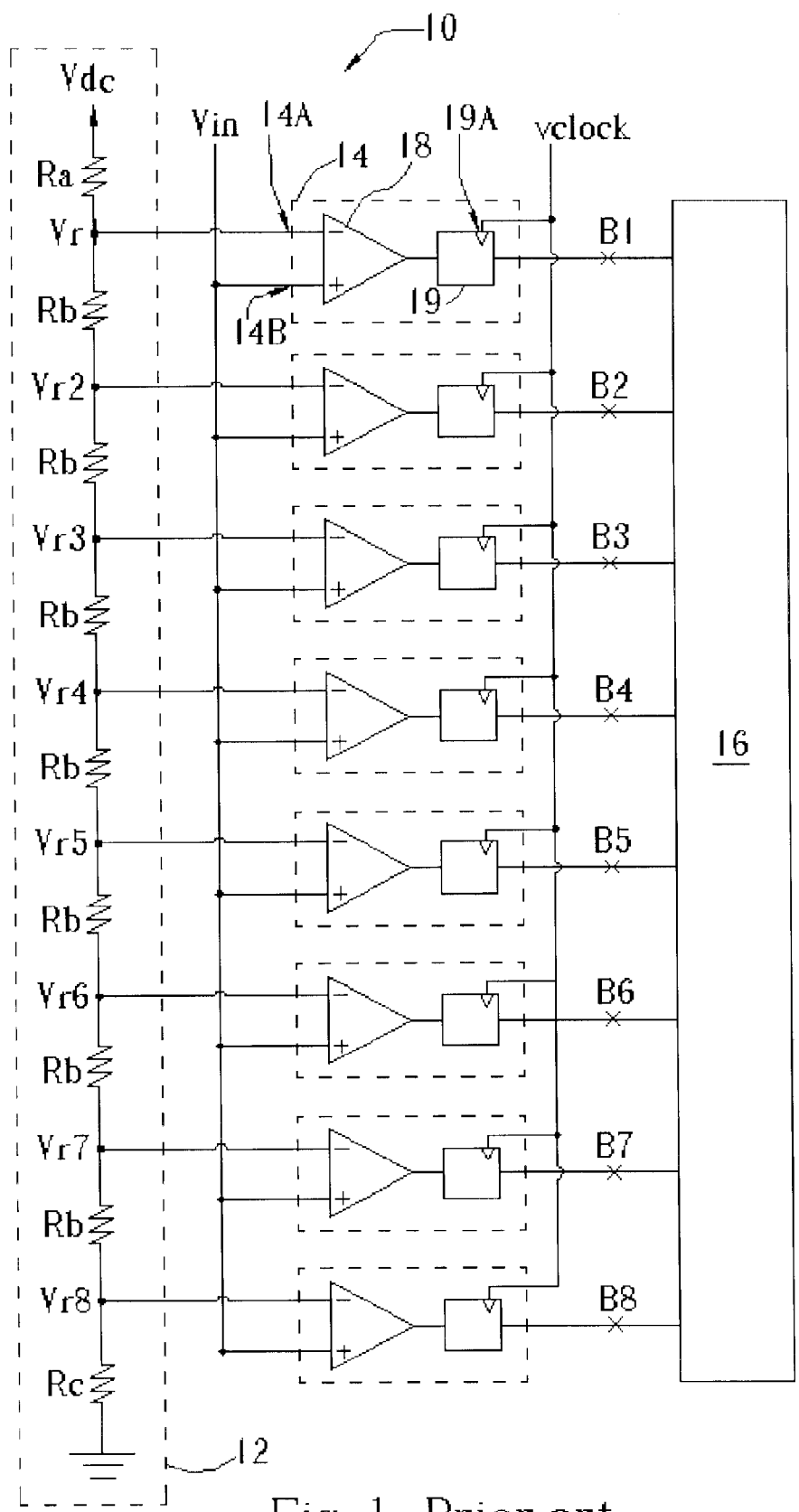
FIG. 1 is a schematic diagram of a prior art data converter.
Figure 2:
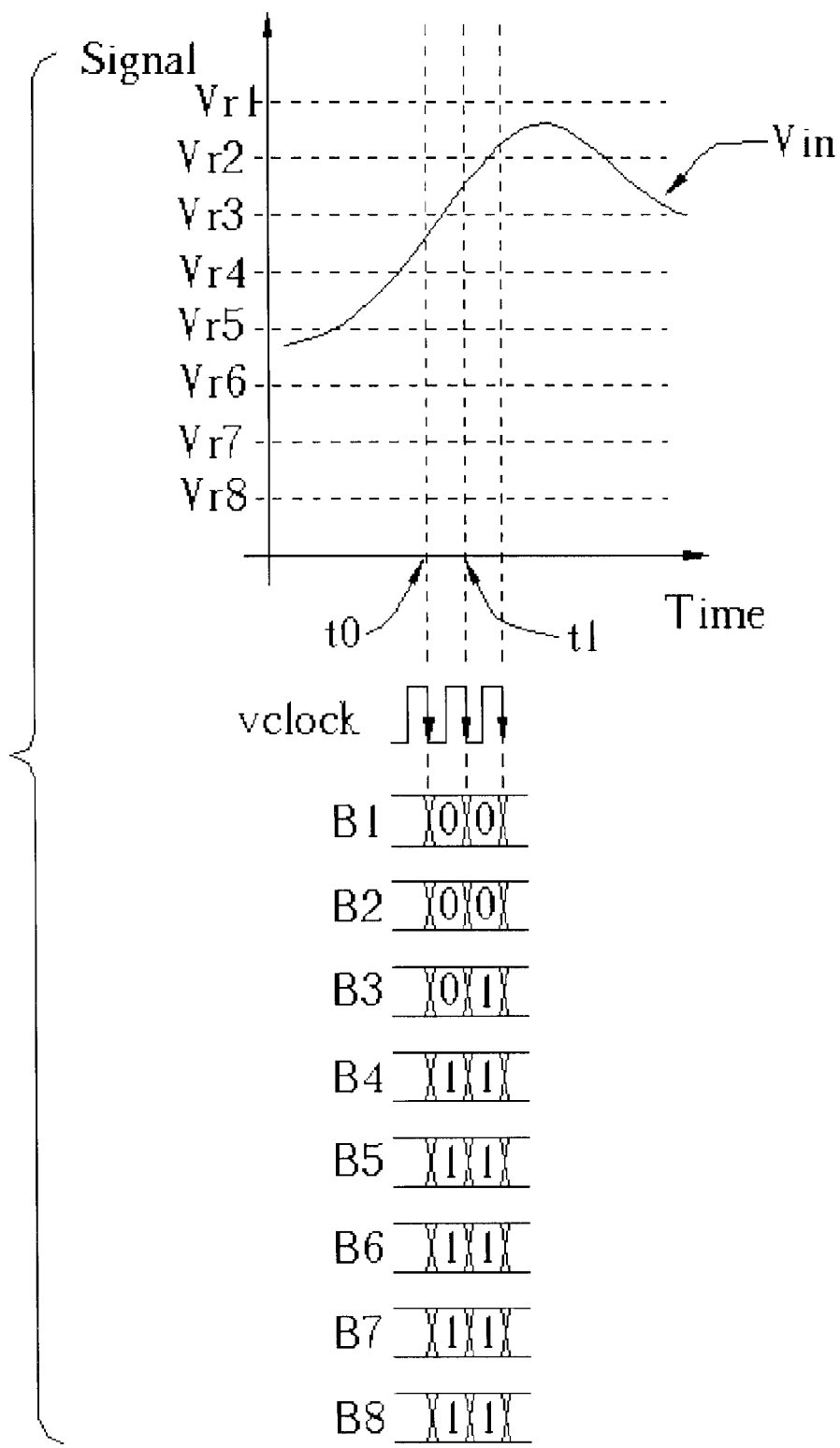
FIG. 2 is a timing diagram of related signals of FIG. 1.
Figure 3:
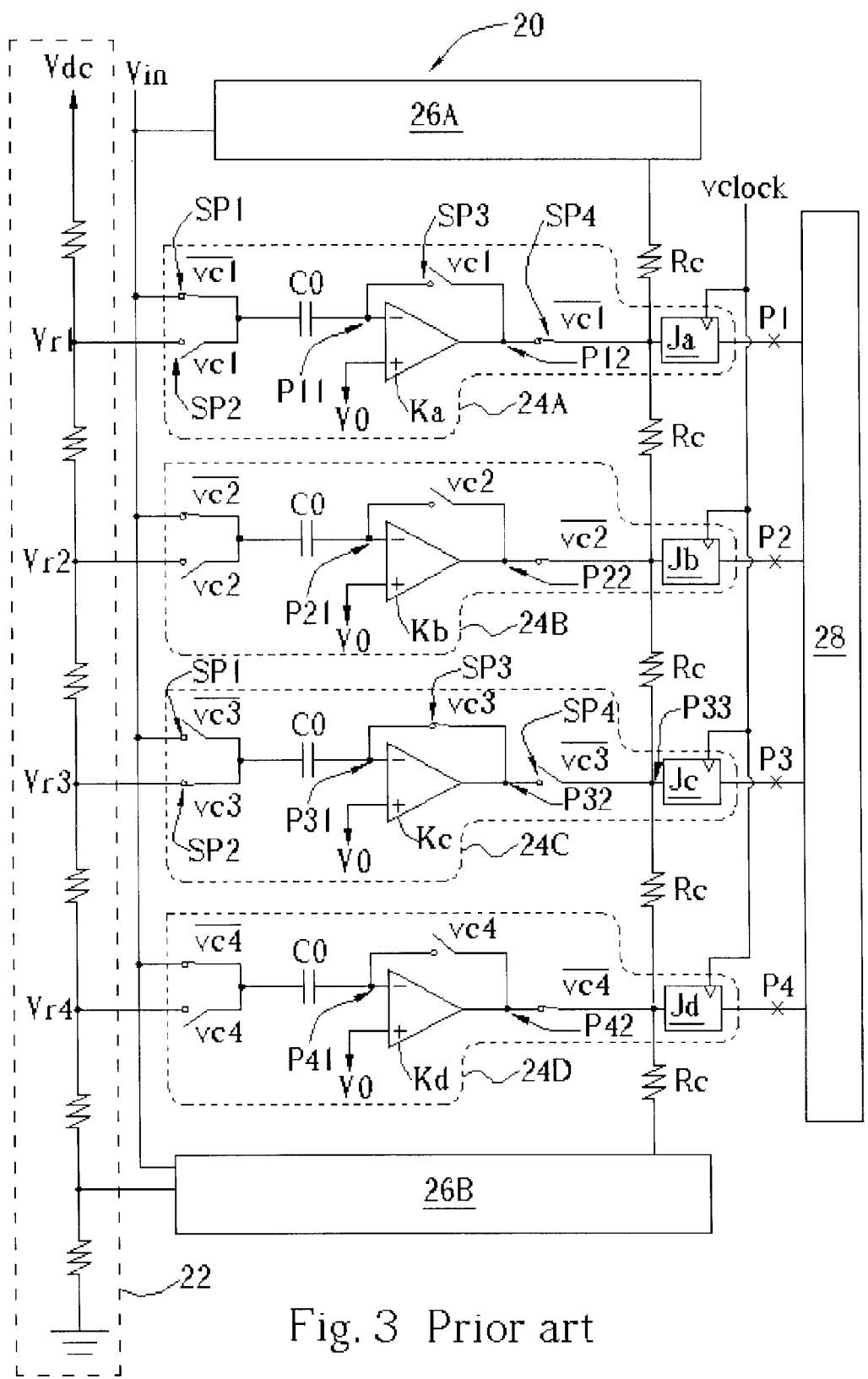
FIG. 3 is a schematic diagram of another prior art data converter.
Figure 4:
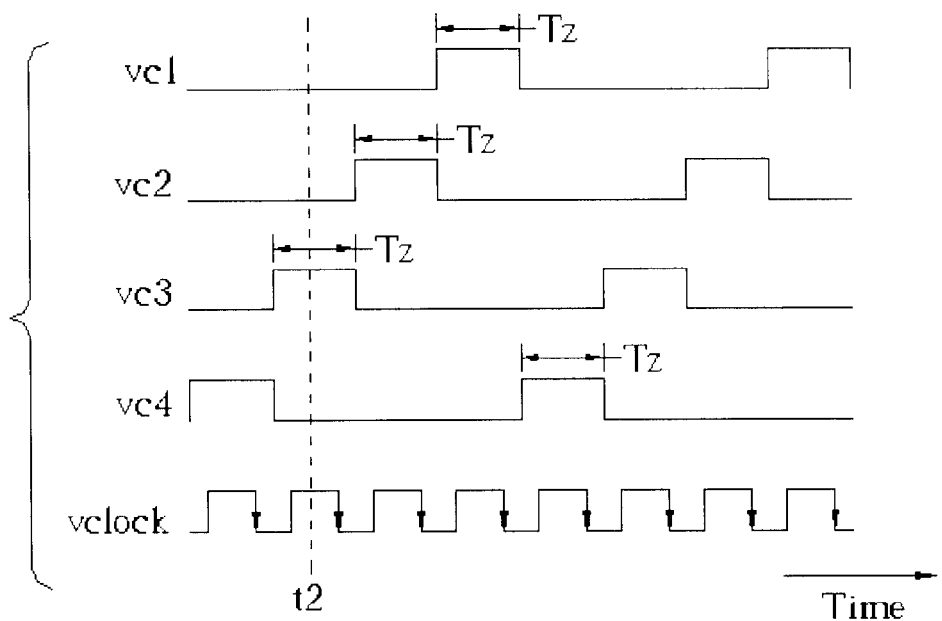
FIG. 4 is a timing diagram of related signals and clock of FIG. 3.
Figure 5:
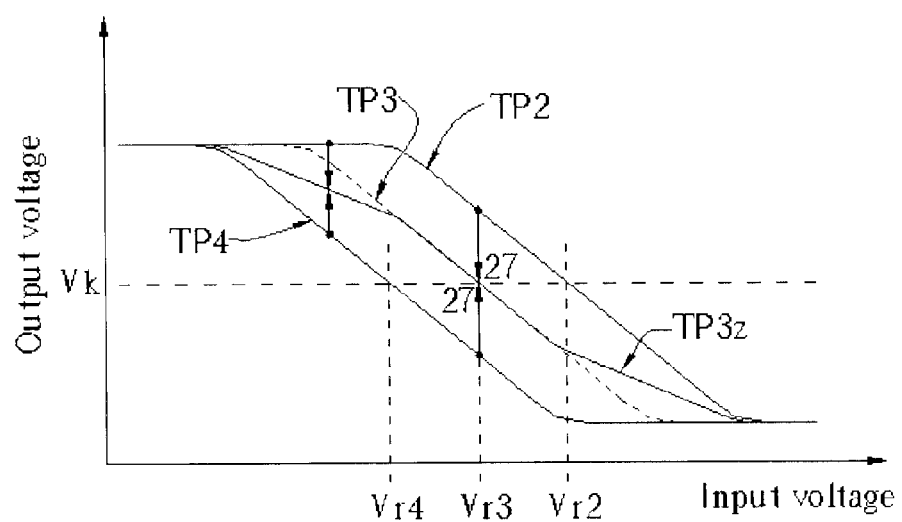
FIG. 5 is a schematic diagram of related converting curves of FIG. 3.
Figure 6:
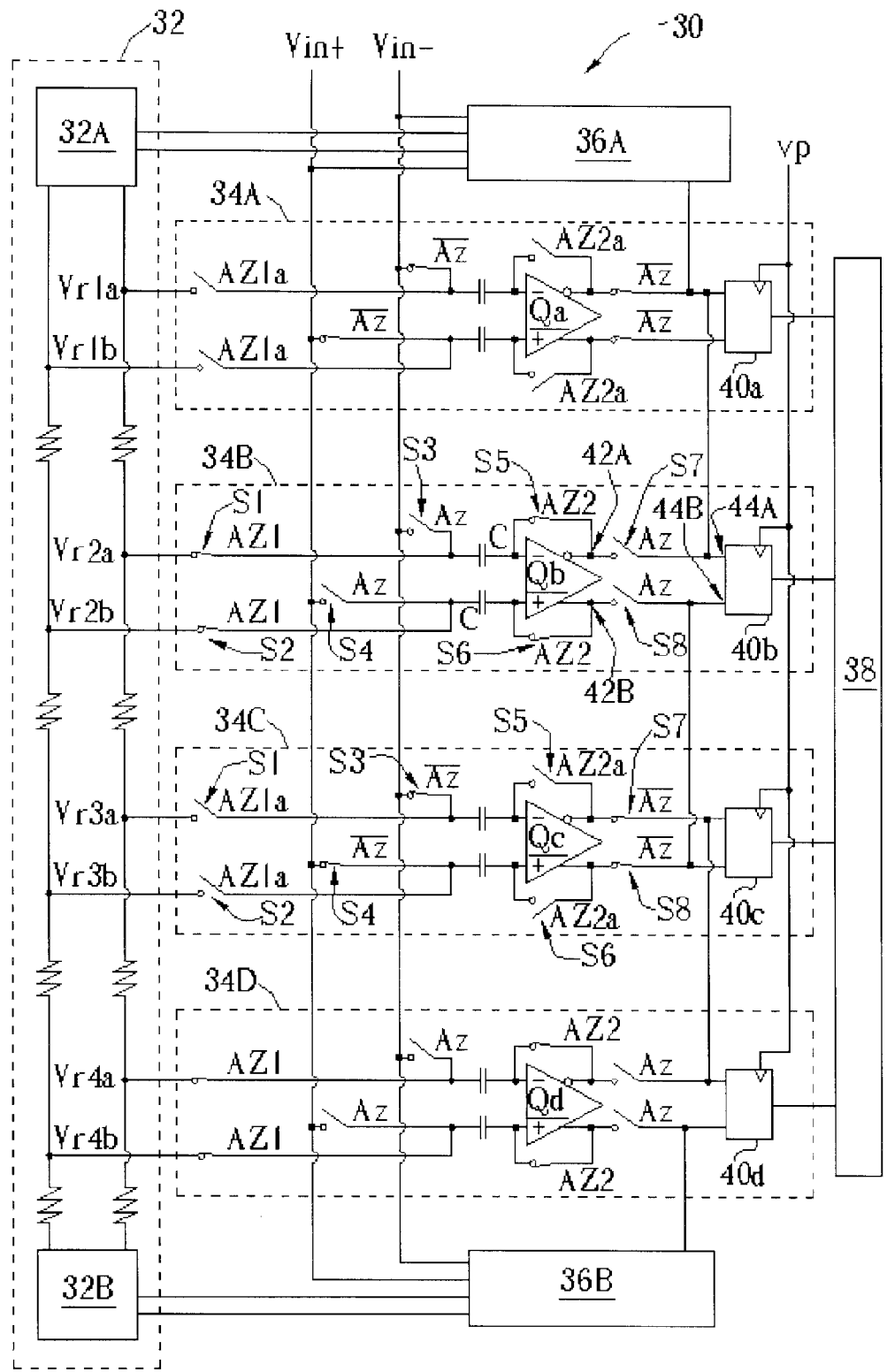
FIG. 6 is a schematic diagram of a first data converter according to the present invention.

Please refer to FIG. 6 of a schematic diagram of a first data converter 30 in the present invention. The data converter 30 is an analog to digital data converter in a differential manner. In another words, the data converter 30 converts a difference of two analog input signals, which are Vin+ and Vin−, to a digital signal. The data converter 30 comprises a voltage dividing circuit 32, auxiliary circuits 36A and 36B, an encoding circuit 38, and a plurality of comparison units. For example, four comparison units 34A to 34D are shown in FIG. 6. To operate in a differential manner, the voltage dividing circuit 32 generates reference voltages Vr1a to Vr4a and Vr1b to Vr4b via resistors and biased circuits 32A and 32B. Since the voltage dividing circuit 32 is similar to those in the prior art, it is obvious without any detailed description.

Each comparison unit has the same structure. For example, the comparison unit 34B comprises eight switches S1 to S8 which are controlled by control signals AZ1, Az, and AZ2, wherein the switches in the comparison units 34A and 34C are controlled by control signals AZ1a and AZ2a and an inverted signal of Az. The switches S1, S2 and S5~S8 can be transistors or transmission gates, and the switches S3 and S4 must be transmission gates. The comparison unit 34B also comprises a differential amplifier Qb comprising two differential input ends, a positive output end 42B and a negative output end 42A. The amplifier Qb comprises feedback circuits between both groups of I/O terminals that are controlled by switches S5 and S6 respectively. Both input ends are electrically connected to capacitors C. The other end of the capacitor C is controlled by switches and electrically connected to a reference voltage or an input signal alternatively. The comparison unit 34B further comprises a latch circuit 40b for latching the amplifier Qb according to a clock vp and generating a corresponding digital signal. For matching the differential output of the amplifier Qb, the latch circuit 40b also works in a differential manner. In another words, if the input at 44A is larger than the input at 44B, the latch circuit 40b outputs a digital signal in a high state. In the same manner, a digital signal in a low state is output if the input at 44B is larger than the input at 44A. Please note that some electric routes are placed between the latch circuits of comparison units. For example, the input end 44A of the latch circuit 40b is electrically connected to an input end of another latch circuit 40a. The other input end 44B of the latch circuit 40b is electrically connected to an input end of the latch circuit 40c.

Figure 7:
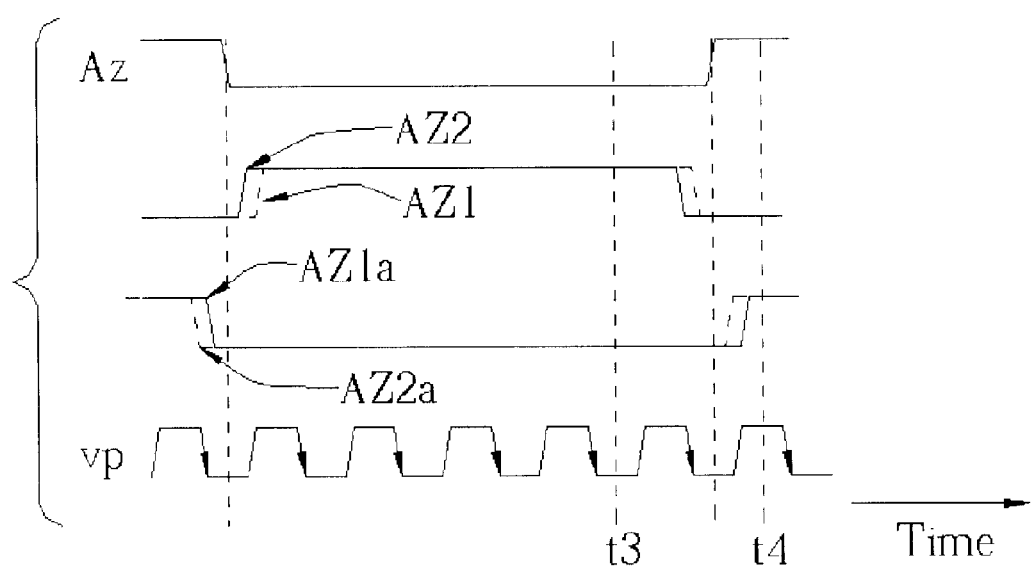
FIG. 7 is a timing diagram of related signals and clock of FIG. 6.

Please refer to FIG. 7; a timing diagram of the control signals Az, AZ1, AZ2, AZ1a and AZ2a and the clock vp is shown. The transverse axis in FIG. 7 is time. Each control signal controls corresponding switches to conduct in the high state and open in the low state. At time t3, the control signal Az controls corresponding switches to open so that closed loops are formed by the feedback circuits of the amplifier Qb of the comparison units 34B and the feedback circuits of the amplifier Qd of the comparison units 34D. Capacitors C of the comparison units described above are electrically connected to reference voltages Vr2a, Vr2b, Vr4a, and Vr4b respectively. The outputs of amplifiers Qb and Qd are electrically disconnected from the latch circuits 40b and 40d. At this time, the comparison units 34B and 34D are in the auto-zeroing process. A comparison unit in the auto-zeroing process charges the capacitor C according to the reference voltage so that the offset voltage is cancelled. Please notice the timing diagram shown in FIG. 7. When the control signal Az is in the low state, the comparison units 34B and 34D are in the auto-zeroing process. The switches of the feedback circuit that control these two amplifiers conduct at first, which means the control signal AZ2 raises to the high state, so that the capacitor is charged to cancel the offset voltage. After that, the control signal AZ1 raises to the high state and electrically connects the capacitors C to the reference voltages for charging the capacitors C.

In contrast with the comparison units 34B and 34D in the auto-zeroing process, the comparison units 34A and 34C are in the comparing process. At this time, the switches controlled by the control signal AZ2a are opened and do not conduct to the feedback circuits of the amplifier Qa and Qc so that these two amplifiers are in open loops. The switches S3 and S4 controlled by the inverted signal of the control signal Az electrically connect the capacitor C to the input signals Vin+ and Vin−. The input signals are electrically coupled to the amplifier. Then, the differential input signals are compared with the reference voltage and the comparison result is output to the corresponding latch circuit in the differential manner. Therefore, the latch circuit generates corresponding digital signals to achieve the purpose of converting analog signals to digital signals.

As described above, the data converter 30 in the present invention is divided into two groups arranged in an interlaced manner. At the same time, half of the comparison units perform the auto-zeroing process and the other half performs the comparing process. To maintain the normal operating functions of the data converter 30, an active interpolation is performed to generate the output of the comparison units that perform the auto-zeroing process.

Figure 8:
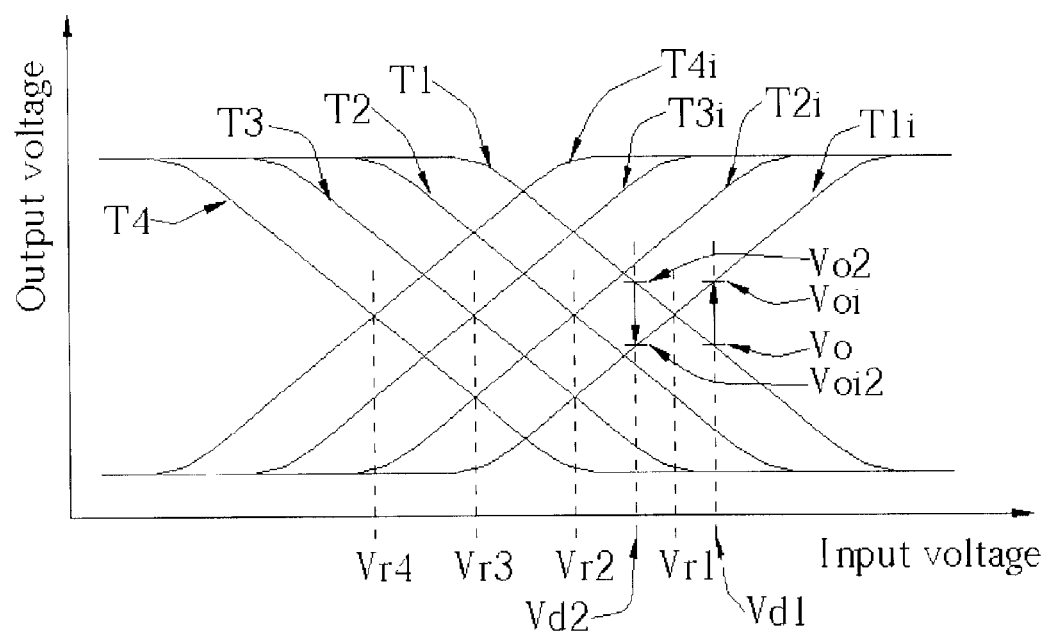
FIG. 8 is a schematic diagram of converting curves of each comparison unit in FIG. 6.

Please refer to FIG. 8 of a schematic diagram of converting curves of positive output ends and negative output ends of the amplifiers Qa to Qd. The transverse axis of FIG. 8 is differential input voltage. The longitudinal axis of FIG. 8 is output voltage. Converting curves T1 to T4 are the converting curves of the positive ends of the amplifiers Qa to Qd and the converting curves T1$i$ to T4$i$ are the converting curves of the negative ends of the amplifiers Qa to Qd. A reference voltage Vr1 marked on the transverse axis corresponds to reference voltages Vr1a and Vr1b. In the same manner, reference voltages Vr2, Vr3, and Vr4 also correspond to Vr2a, Vr2b, Vr3a, Vr3b, Vr4a, and Vr4b. The comparing process of the input signals and the reference voltage of the amplifiers are performed as following. When the differential input signals of the comparison unit, for instance 34A, are larger than the reference voltage Vr1 such as Vd1, the output voltage Voi of the positive end of the amplifier Qa, which is described in the converting curve T1$i$, is larger than the output voltage Vo of the negative end, which is described in the converting curve T1. The latch circuit 40a responds to the output voltage Voi and Vo to generate an output in a differential manner, for instance in a high state. If the differential input voltage Vd2 is less than the reference voltage Vr1, the output voltage of the negative end is larger than the output voltage Vo of the positive end. The latch circuit 40a generates an output in a low state.

Figure 9:
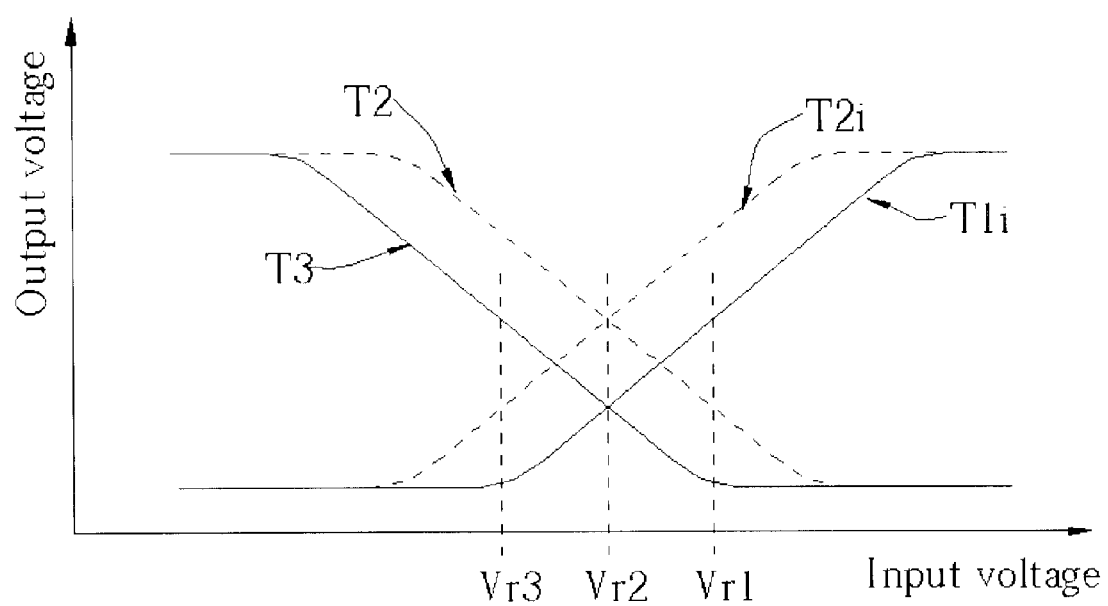
FIG. 9 is a schematic diagram of interpolated converting curves of comparison units in FIG. 6.

The intersection of the converting curves of output of the positive and corresponding negative ends are the reference voltages in the transverse axis used to trigger the corresponding latch circuit by the amplifier so that the state of the output signals is changed. Next, please refer to FIG. 9 of a schematic diagram of replacing the comparison unit 34B in an active interpolation. The transverse axis and longitudinal axis are the same as FIG. 8. Converting curves T1, T2, T2$i$ and T3 are respectively related to a positive output end of the amplifier Qa, a positive output end of the amplifier Qb, a negative output end of the amplifier Qb and a positive output end of the amplifier Qc. When the comparison unit 34B performs the auto-zeroing process, the negative output end of the amplifier Qa and the positive output end of the amplifier Qc are electrically connected to the differential input end of the latch circuit 40b as shown in FIG. 6. At this time, output digital signals of the latch circuit 40b are determined by output of the negative output end of the amplifier Qa and the positive output end of the amplifier Qc. Converting curves of these two output ends are illustrated as the converting curves T1$i$ and T3 in FIG. 9. If the reference voltage Vr2 is the interpolation of the reference voltage Vr1 and Vr3, which can be achieved by proper design, the intersection of the converting curve T1$i$ and T3 is corresponding to the reference voltage Vr2 on the transverse axis. The converting characteristic of the interpolation of the converting curves T1$i$ and T3 is different from the converting characteristics of the original converting curves T2 and T2$i$ of the amplifier Qb. However, the latch circuit corresponding to the amplifier Qb is driven in a differential manner. Thus, the converting curves T1$i$ and T3 intersect at the reference voltage Vr2 on the transverse axis correctly and the latch circuit operates correctly. If the differential signal is larger than the reference voltage Vr2, the output signal of the negative output end of the amplifier Qa is larger than the output voltage. If the comparison unit 34B performs the auto-zeroing process, the latch circuit 40b, which receives the output of the negative output end of the amplifier Qa and the positive output end of the amplifier Qc, generates a digital signal in the high state. Relatively, if the differential input signal is less than the reference voltage Vr2, the output voltage of the negative output end of the amplifier Qa is less than that of the positive output end of the amplifier Qc, and the latch circuit 40n generates a digital signal in the low state. The comparison unit Qb that is performing the auto-zeroing process, is replaced by an interpolation of the output of the amplifier Qa and Qc instead of the average of resistor network.

As shown in FIG. 6 and FIG. 7, when half of the comparison units perform the auto-zeroing process, the other comparison units perform the comparison process for comparing the differential input signal with a reference voltage of each comparison unit. The corresponding latch circuit generating a digital signal based upon the comparison result. At the same time, the comparison units performing the comparison process generate digital signals for the comparison units performing auto-zeroing process. As shown in FIG. 6, the comparison units 34A and 34C perform the comparing process and the other comparison units 34B and 34D perform the auto-zeroing process at time t3 shown in FIG. 7. The comparing function of the comparison unit 34B is replaced by using an active interpolation between the comparison units 34A and 34C. The comparing function of the comparison unit 34D is replaced by using an active interpolation between the comparison unit 34C and the auxiliary circuit 36B. In practice, the auxiliary circuit 36B can be also a comparison unit. In this design, the auxiliary circuit is similar to a circuit between the comparison unit 34A to 34D, but the latch circuit in the auxiliary circuit 36B can be an equivalent loading circuit because the auxiliary circuit does not need to generate digital signals but provides an output voltage for the amplifier to interpolate actively with the comparison unit 34C for replacing the comparison unit 34D in the auto-zeroing process.

Figure 10:
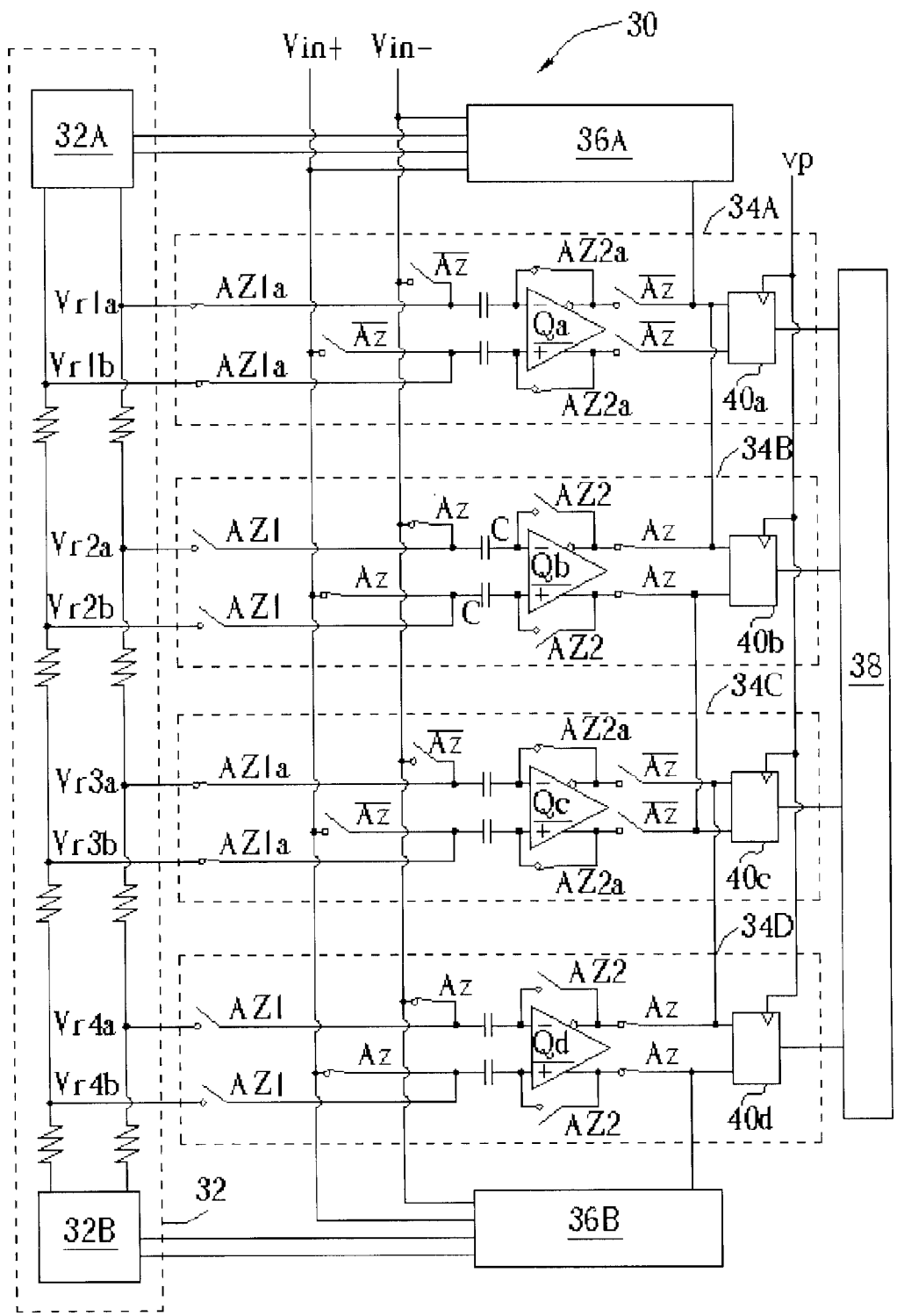
FIG. 10 is a schematic diagram of the data converter in FIG. 6 in another operating state.
Figure 11:
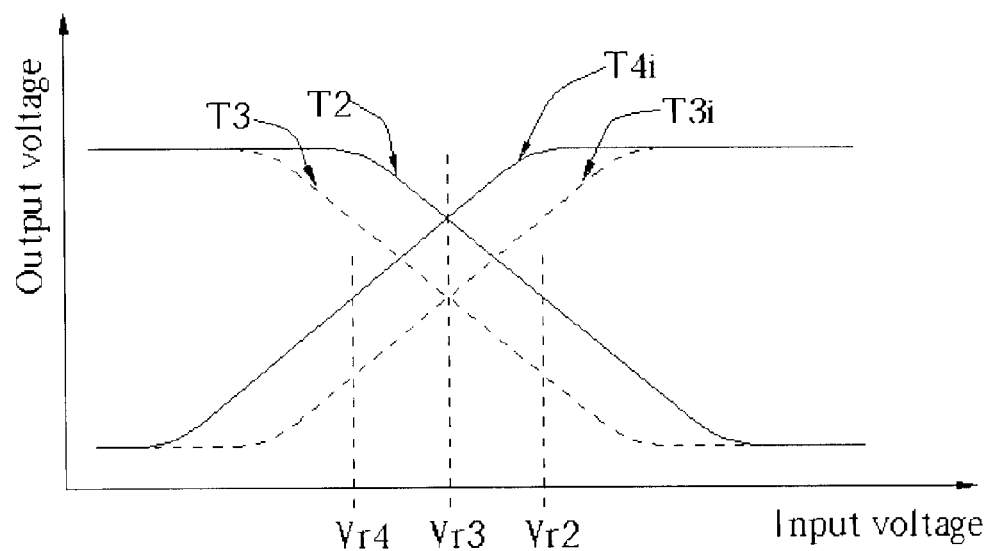
FIG. 11 is a schematic diagram of interpolated converting curves of comparison units in FIG. 10.

Please refer to FIG. 10 of a schematic diagram of an operating state of the data converter 30 at the time t4 shown in FIG. 7. At this time, the comparison units 34A and 34c perform the auto-zeroing process, and the comparison units 34B and 34D perform the comparing process. The comparing function of the comparison unit 34C is replaced by an active interpolation between the comparison units 34B and 34D and that of the comparison unit 34A is replaced by an active interpolation between the auxiliary circuit 36A and the comparison unit 34B. The auxiliary circuit 36A is substantially the same as the auxiliary circuit 36B. Please refer to FIG. 11 of a schematic diagram of replacing the comparing function of the comparison unit 34C by an active interpolation between the comparison units 34B and 34D. FIG. 11 is similar to FIG. 8 and FIG. 9. Converting curves T2, T3 and T4i are converting curves of the negative output end of the amplifier Qb, the negative output end of the amplifier Qc, and the positive output end of the amplifier Qd. Please notice that the negative output end of the amplifier Qb in the comparison unit 34B and the positive output end of the amplifier Qd in the comparison unit 34D is used to replace the negative and positive output ends of the amplifier Qc of the comparison unit 34C. As known, the interpolation is different from the case shown in FIG. 9. If the converting curves T2 and T4i intersect at the reference voltage Vr3 on the transverse axis, the converting curves T2 and T4i are still able to drive the latch circuit 40c in the comparison unit 34C correctly and a differential drive formed by the converting curves t3 and T3i of the amplifier Qc is replaced.

Figure 12:
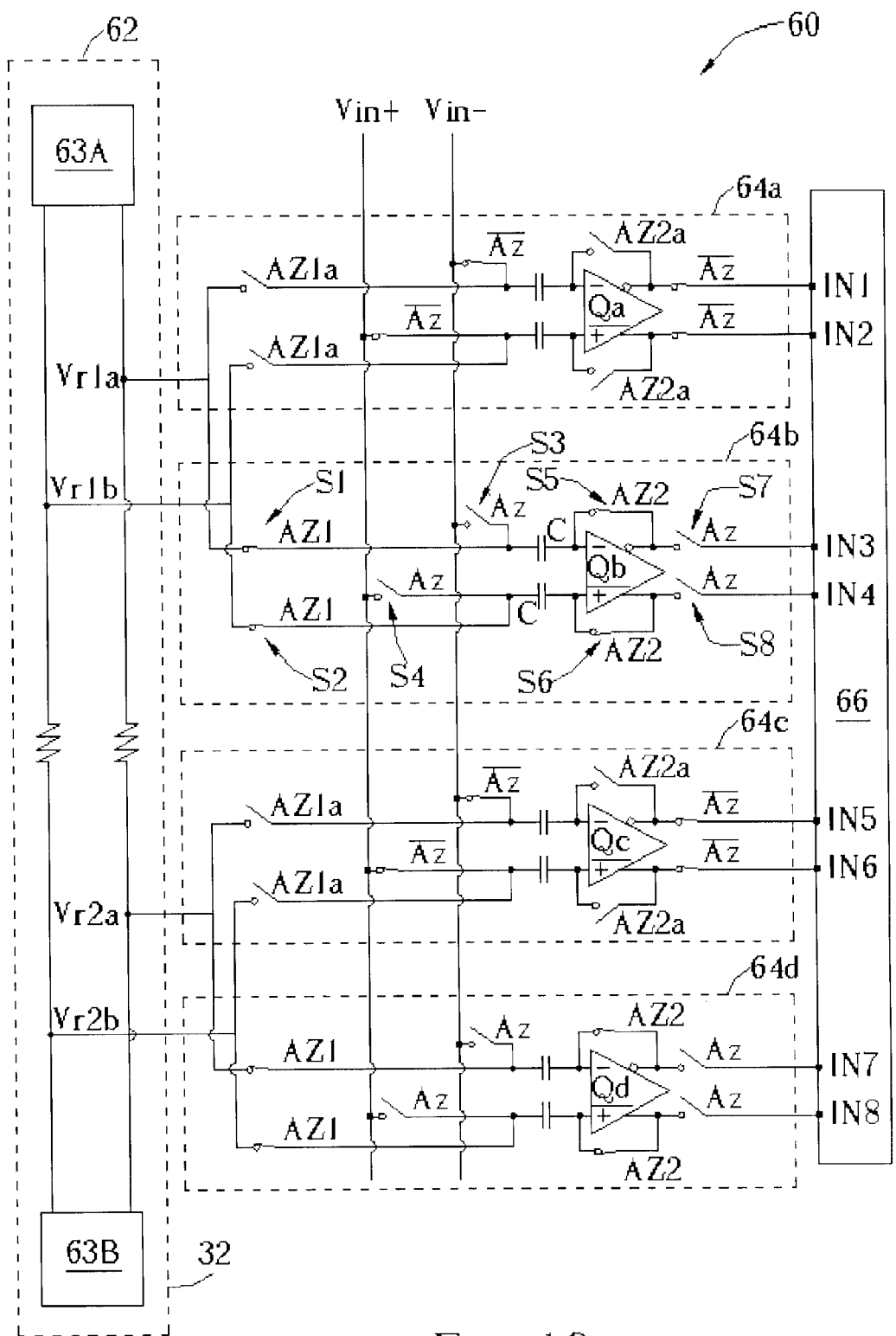
FIG. 12 is a schematic diagram of a second data converter according to the present invention.

Please refer to FIG. 12, which is a schematic diagram of a second data converter 60 according to the present invention. The data converter 60 is an analog to digital data converter that performs in a differential manner. In another words, the data converter 60 converts a difference of two analog input signals, which are Vin+ and Vin−, to digital signals such as digital bits. The data converter 60 comprises a voltage dividing circuit 62, a plurality of comparison units 64a, 64b, 64c, 64d, and an output unit 66. Please note that only four comparison units 64a, 64b, 64c, 64d are shown in FIG. 12. However, the total number of comparison units used in the data converter 60 according to the present invention is not limited. To operate in a differential manner, the voltage dividing circuit 62 generates reference voltages Vr1a, Vr2a, Vr1b, and Vr2b via resistors and biased circuits 63A and 63B. Since the voltage dividing circuit 62 is similar to those in the prior art, it should require no further description.

Each comparison unit has the same structure, For example, the comparison unit 641, comprises eight switches S1 to S8 which are controlled by control signals AZ1, Az, and AZ2, wherein the switches in the comparison units 64A and 64C are controlled by control signals AZ1a and AZ2a and an inverted signal of Az. The comparison unit 64b also comprises a differential amplifier Qb comprising two differential input ends, a positive output end and a negative output end. In addition, the amplifier Qb comprises two feedback circuits controlled by switches S5 and S6 respectively. Both input ends are electrically connected to capacitors C. The other ends of the capacitors C are controlled by switches S3, S4 and arc electrically connected to a reference voltage or an input signal, alternatively. The switches S1, S2 are used to control if reference voltages Vr1a, Vr1b are inputted into the comparison unit 64b, and the switches S7, S8 are used to control if the positive output end and the negative output end of the amplifier Qb are electrically connected to input nodes IN3, IN4 of the output unit 66. As shown in FIG. 12, a positive output end and the negative output end of an amplifier Qc are controlled to be electrically connected to input nodes IN1, IN2; a positive output end and a negative output end of an amplifier Qa are controlled to be electrically connected to input nodes IN5, IN6; finally, a positive output end and a negative output end of the amplifier Qd are controlled to be electrically connected to input nodes IN7, IN8.

Figure 13:
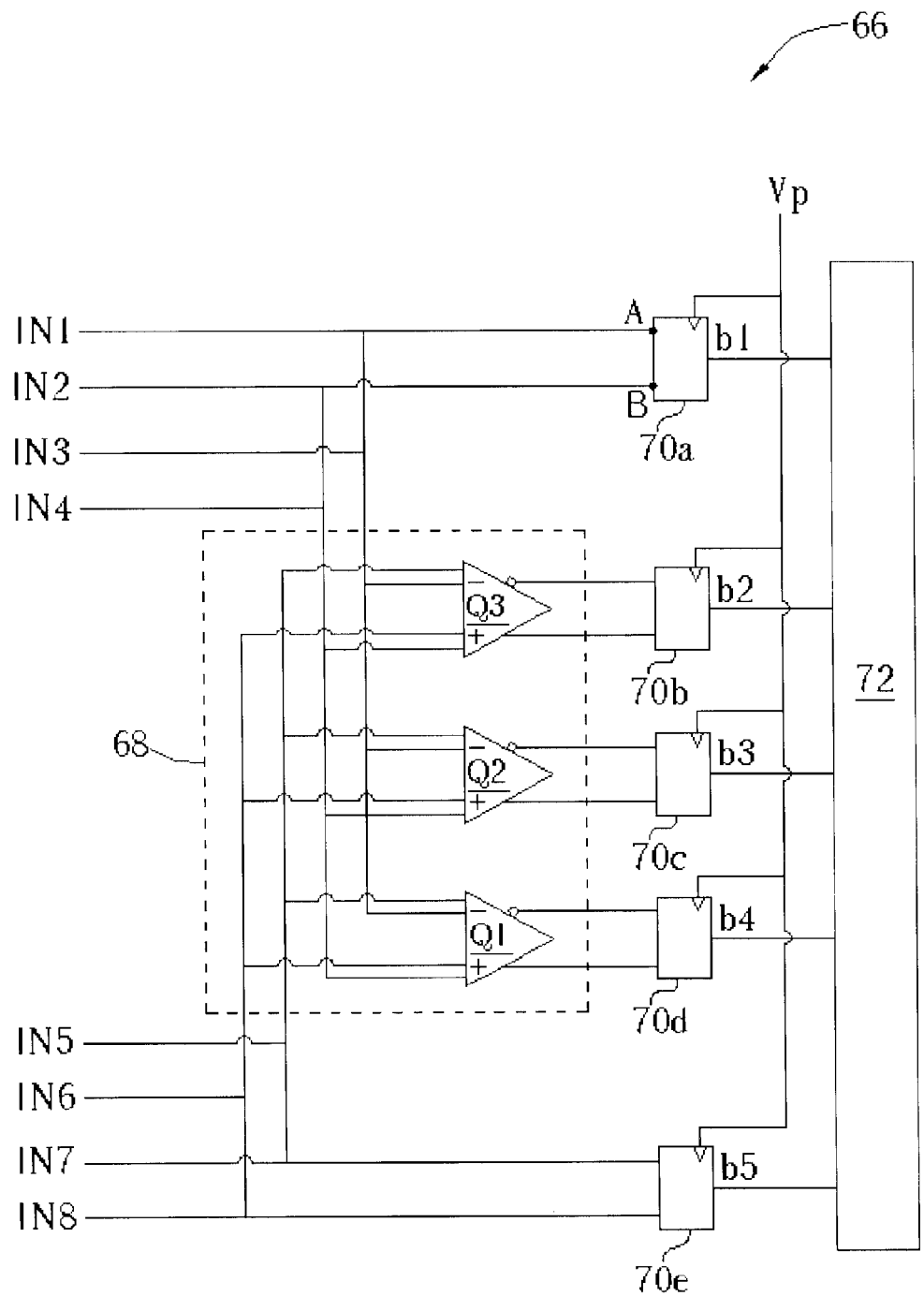
FIG. 13 is a schematic diagram of an output unit shown in FIG. 12.

Please refer to FIG. 13, which is a schematic diagram of the output unit 66 shown in FIG. 12. The output unit 66 includes an interpolating unix 68, a plurality of latches 70a, 70b, 70c, 70d, 70e, and encoding logic 72. The interpolating unit 68 has three differential amplifiers Q1, Q2, Q3, and each of the differential amplifiers Q1, Q2, Q3 has two pairs of differential input ends, a positive output end, and a negative output end. The latch 70a is used for latching a digital bit b1 associated with either the comparison unit 64a or the comparison unit 64b according to a clock. Vp Similarly, the latch 70e is used for latching a digital bit b5 associated with either the comparison unit 64d or the comparison unit 64c according to the same clock Vp. In addition, the latches 70b, 70c, 70d are respectively used for latching digital bits b2, b3, b4 associated with the differential amplifiers Q1, Q2, Q3. For matching the differential output of the amplifiers Qa, Qb, Qc, Qd, Q1, Q2, Q3, each of the latches 70a, 70b, 70c, 70d, 70e also works in a differential manner. For example, if the input at node A of the latch 70a is larger than the input at node B of the latch 70a, the latch 70a outputs the digital bit b1 that corresponds to a high logic level. In the same manner, a low logic level is assigned to the digital bit b1 if the input at node B is larger than the input at node A. In the end, the encoding logic 72 generates a digital value based on the received digital bits b1, b2, b3, b4, b5.

Please refer to FIGS. 11 and 12 in conjunction with FIG. 7. The second data converter 60 operates according to the timing diagram shown in FIG. 7. If a control signal corresponds to the high logic level, a switch controlled by the control signal is switched on to transfer signals. On the other hand, if the control signal corresponds to the low logic level, the switch controlled by the control signal is switched off to block signals from being transmitted. As shown in FIG. 7, the control signals Az, AZ1a, AZ2a at time t3 correspond to the low logic level, but the controls signals AZ1, AZ2 correspond to the high logic level. Therefore, the comparison units 64b, 64d are in the auto-zeroing process, and the comparison units 64a and 64C are in the comparing process. At this time, the switches controlled by the control signal AZ2a are opened and do not establish the feedback paths for the amplifiers Qa, Qc. Because the control signal AZ corresponds to the high logic level, the capacitors C are electrically connected to the input signals Vin+ and Vin−.

With regards to the amplifier Qa, the differential input signals Vin+, Vin− are compared to the reference voltages Vr1a, Vr1b previously stored by the capacitors C, and corresponding signals output from the positive output end and the negative output end are further transmitted to the input nodes IN1, IN2 of the output unit 66. With regard to the amplifier Qc, the differential input signals Vin+, Vin− are compared with to reference voltages Vr2a, Vr2b previously stored by the capacitors C, and corresponding signals output from the positive output end and the negative output end are further transmitted to the input nodes IN5, IN6 of the output unit 66.

Figure 14:
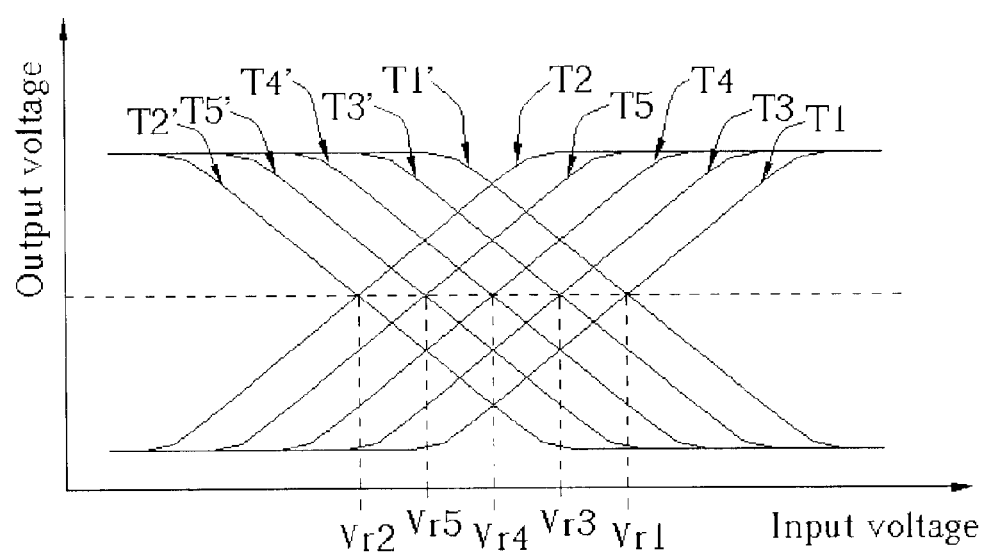
FIG. 14 is a schematic diagram of converting curves of comparison units shown in FIG. 12 and FIG. 13.

When the signals output from the amplifier Qa are transmitted to the latch 70a, the latch 70a latches the digital bit b1 in the above-mentioned differential manner. Similarly, the latch 70e also latches the digital bit b5 in the above-mentioned differential manner when the signals output from the amplifier Qc are transmitted to the latch 70e. It is obvious that comparison units Qa, Qb, Qc, Qd are divided into two groups arranged in an interlaced manner. At the same time, half of the comparison units perform the auto-zeroing process and the other half performs the comparing process. In the preferred embodiment, an active interpolation is performed so that the interpolating unit 68 is capable of generating the digital bits. The operation of the active interpolation is described as follows. Please refer to FIG. 14, which is a schematic diagram of converting curves of the comparison units shown in FIG. 12 and FIG. 13. The transverse axis shown in FIG. 14 represents differential input voltages. The longitudinal axis shown in FIG. 14 represents output voltages. The converting curve T1 represents a voltage conversion characteristic for the signal output from the positive output end of the amplifier Qa, and the converting curve T1' represents a voltage conversion characteristic for the signal output from the negative output end of the amplifier Qa. The converting curve T2 represents a voltage conversion characteristic for the signal output from the positive output end of the amplifier Qc, and the converting curve T2' represents a voltage conversion characteristic for the signal output from the negative output end of the amplifier Qc. A voltage Vr1 marked on the transverse axis corresponds to reference voltages Vr1a, Vr1b. In the same manner, reference voltage Vr2 also corresponds to the reference voltages Vr2a, Vr2b. As described before, the intersections of the converting curves associated with the positive and corresponding negative ends correspond to the reference voltages in the transverse axis used to determine the digital bite latched by the corresponding latches. For example, if the differential input voltages Vin+, Vin− are greater than the reference voltage Vr1, the voltage level at the positive output end of the amplifier Qa is greater than the voltage level at the negative output end of the amplifier Qa according to the converting curves T1, T1'. In other words, the voltage level at node B of the latch 70a is greater than the voltage level at node A of the latch 70a. Therefore, the digital bit is latched at the high logic level "1". On the other hand, if the differential input voltages Vin+, Vin− are less than the reference voltage Vr1, the voltage level at the positive output end of the amplifier Qa is less than the voltage level at the negative output end of the amplifier Qa according to the converting curves T1, T1'. In other words, the voltage level at node B of the latch 70a is less than the voltage level at node A of the latch 70a. Therefore, the digital bit is latched at the low logic level "0". Similarly, the digital bit b5 is also obtained according to the same process mentioned above.

As shown in FIG. 13, the signal output from the negative output end of the amplifier Qa is further passed to one differential input of each amplifier Q1, Q2, Q3, and the signal output from the negative output end of the amplifier Qc is also passed to the same differential input of each amplifier Q1, Q2, Q3. In addition, the signal outputted from the positive output end of the amplifier Qa is further passed to another differential input of each amplifier Q1, Q2, Q3, and the signal output from the positive output end of the amplifier Qc is also passed to the same differential input of each amplifier Q1, Q2, Q3. Taking the amplifier Q1 as an example, the signals transmitted from input nodes IN1, IN5 are processed by the amplifier Q1 to generate one differential output signal output from the negative output end of the amplifier Q1, and the signals transmitted from input nodes IN2, IN6 are processed by the amplifier Q1 to generate another differential output signal output from the positive output end of the amplifier Q1. The latch 70d then latches the digital bit b4 with an appropriate logic level according to the differential output signals.

In the preferred embodiment, each of the amplifiers Q1, Q2, Q3 corresponds to a specific voltage conversion characteristic through proper gain setting. With regard to the amplifier Q3, the amplifier Q3 amplifies the signal transmitted from the input node IN6 via a gain value equaling 3/4, and the amplifier Q3 amplifies the signal transmitted from the input node IN2 via a gain value equaling 1/4, Then, amplifier Q3 superposes these two amplified signals to generate one differential output signal outputted from the positive output end. The converting curve T1 correspond to the signal transmitted by the input nodes IN6, and the converting curve T2 corresponds to the signal transmitted by the input node IN2. Therefore, the voltage conversion characteristic associated with the positive output end of the amplifier Q3 corresponds to the converting curve T3 shown in FIG. 14 because of the executed interpolation process. Similarly, the amplifier Q3 amplifies the signal transmitted from the input node IN5 via a gain value equaling 3/4, and the amplifier Q3 amplifies the signal transmitted from the input node IN1 via a gain value equaling 1/4, Then, amplifier Q3 superposes these two amplified signals to generate another differential output signal outputted from the negative output end. The converting curve T1 corresponds to the signal transmitted by the input nodes IN5, and the converting curve T2 corresponds to the signal transmitted by the input node IN1. Therefore, the voltage conversion characteristic associated with the negative output end of the amplifier Q3 corresponds to the converting curve T3' shown in FIG. 14 because of the executed interpolation process. In addition, the intersection of the converting curves T3, T3' corresponds to a reference voltage Vr3 interpolated between original reference voltages Vr1, Vr2.

With regard to the amplifier Q2, the amplifier Q2 amplifies the signal transmitted from the input node IN6 via a gain value equaling 2/4, and the amplifier Q2 amplifies the signal transmitted from the input node IN2 via a gain value equaling 2/4, Then, amplifier Q2 superposes these two amplified signals to generate one differential output signal outputted from the positive output end. Therefore, the voltage conversion characteristic associated with the positive output end of the amplifier Q2 corresponds to the converting curve T4 shown in FIG. 14 because of the executed interpolation process. Similarly, the amplifier Q2 amplifies the signal transmitted from the input node IN5 via a gain value equaling 2/4, and the amplifier Q2 amplifies the signal transmitted from the input node IN1 via a gain value equaling 2/4, Then, amplifier Q2 also superposes these two amplified signals to generate another differential output signal output from the negative output end. Therefore, the voltage conversion characteristic associated with the negative output end of the amplifier Q2 corresponds to the converting curve T4' shown in FIG. 14 because of the executed interpolation process. In addition, the intersection of the converting curves T4 T4' corresponds to a reference voltage Vr4 interpolated between original reference voltages Vr1, Vr2.

With regard to the amplifier Q1, the amplifier Q1 amplifies the signal transmitted from the input node IN6 via a gain value equaling 1/4, and the amplifier Q1 amplifies the signal transmitted from the input node IN2 via a gain value equaling 3/4, Then, amplifier Q1 superposes these two amplified signals to generate one differential output signal output from the positive output end. The voltage conversion characteristic associated with the positive output end of the amplifier Q1 corresponds to the converting curve T5 shown in FIG. 14 because of the executed interpolation process. Similarly, the amplifier Q1. amplifies the signal transmitted from the input node IN5 via a gain value equaling 1/4, and the amplifier Q1 amplifies the signal transmitted from the input node IN1 via a gain value equaling 3/4, Then, amplifier Q1 also superposes these two amplified signals to generate another differential output signal output from the negative output end. The voltage conversion characteristic associated with the negative output end of the amplifier Q1 corresponds to the converting curve T5' shown in FIG. 14 because of the executed interpolation process. In addition, the intersection of the converting curves T5, T5' corresponds to a reference voltage Vr5 interpolated between original reference voltages Vr1, Vr2.

From the above description, three reference voltages Vr3, Vr4, Vr5 are interpolated with proper gain setting designed for the amplifiers Q1, Q2, Q3 within the interpolating unit 68. It is obvious that the digital bits latched by the latches 70b, 70c, 70d are obtained by the active interpolation with the help of the amplifiers Q1, Q2, Q3. Please note that the amplifiers Qa, Qb have the same characteristics, and the amplifiers Qc, Qd have the same characteristics. Therefore, when the amplifiers Qa, Qc perform the comparing process, and the amplifiers Qb, Qd perform the auto-zeroing process, the amplifiers Qa, Qc, Q1, Q2, Q3 correspond to the converting curves shown in FIG. 14. However, when the amplifiers Qb, Qd perform the comparing process, and the amplifiers Qa, Qc perform the auto-zeroing process, the amplifiers Qb, Qd, Q1, Q2, Q3 also correspond to the converting curves shown in FIG. 14. In other words, when one group consisting of comparison units 64a, 64c performs the comparing process, another group consisting of comparison units 64b, 64d then perform the auto-zeroing process. On the other hand, when one group consisting of comparison units 64b, 64d performs the comparing process, another group consisting of comparison units 64a, 64c then perform the auto-zeroing process. In addition, the latches 70a, 70b, 70c, 70d, 70e are triggered by the clock Vp to generate digital bits b1, b2, b3, b4, b5 according to the same reference voltages Vr1, Vr2 set by the voltage dividing circuit 62 and the reference voltages Vr3–Vr5 determined by the active interpolation. Therefore, the comparison units 64a, 64b correspond to the same voltage conversion characteristic, and the comparison units 64c, 64d correspond to the same voltage conversion characteristic as well.

Though two comparison units 64a, 64b are alternatively used to compare reference voltages Vr1a, Vr1b and the input signals Vin+, Vin−, and two comparison units 64c, 64d are alternatively used to compare reference voltages Vr2a, Vr2b and the input signals Vin+, Vin−, five digital bits b1, b2, b3, b4, b5 are generated. Therefore, additional digital bits are generated with the help of the interpolating unit 68, and the resolution associated with the data conversion is not degraded.

As shown in FIG. 13, only three amplifiers Q1, Q2, Q3 are used to cause the latches 70b, 70c, 70d to latch digital bits b2, b3, b4 according to the interpolated three reference voltages Vr3, Vr4, Vr5. However, the interpolating unit 68 is capable of having N amplifiers to perform the active interpolation. Therefore, N latches corresponding to the N amplifiers need to be positioned inside the output unit 66 for latching N digital bits. Each of the N amplifiers is designed to have a specific gain setting so that N interpolated reference voltages are equally distributed between the reference voltages Vr1, Vr2. In addition to the original latches, the N latches are capable of latching added digital bits generated from the active interpolation. For example, if N=3, the combination is 1/4, 2/4 and 3/4; and if N=7, the combination is 1/8, 2/8, 3/8, 4/8, 5/8, 6/8 and 7/8 Therefore, it is clear that the larger the N is, the more possible combination is available.

In summary, the data converter of the present invention comprises a group of comparison units performing the auto-zeroing process and another group of comparison units performing the comparing process to generate corresponding digital signals and outputs of the comparison units performing the auto-zeroing process with an active interpolating manner. In contrast to the prior art, the data converter in the present invention offers several advantages. It is more flexible. The present invention uses an active interpolating manner so that the circuit structure is simpler and the resistor network is not required. Thus, time and cost for the designing and manufacturing is relatively reduced, and the operation is more precise. The problem of matching incorrectly is therefore also solved. The active interpolating manner in the present invention is less sensitive to the non-linear converting curves of the amplifier. The active interpolation used in the present invention only requires the converting curves of the positive and negative output ends of neighboring interpolating amplifier to be odd symmetric to each other and intersect at correct positions for the latch circuit to be driven in a differential manner. Thus, the requirement of the linear range of the converting curves in the present invention is lower than that in prior art.

The claimed data converter also utilizes interpolating units respectively electrically connected between two adjacent comparison units of the same group. When adjacent comparison units of one group run the comparison process, the corresponding interpolating unit is activated to generate interpolated digital bits through active interpolation. At the same time, the adjacent comparison units of another group perform the auto-zeroing process.

The prior comparison units are switched between the auto-zeroing process and comparing process one by one. Therefore, each comparison unit needs a specific control signal. That means the number of the control signals increase when the number of comparison units increase. The conventional data converter requires a complicated circuit to generate enough control signals in different phase and circuit layout for transmitting those control signals to the corresponding comparison units also increases the circuit difficulty. When redesigning another circuit with a different number of comparison units, all the timing of the control signals and related circuits must be redesigned. In the present invention, one group of the comparison units performs the comparing process and the other group performs the auto-zeroing process. Only two groups of control signals are required to control switching of all comparison units between the comparing process and the auto-zeroing process in an interlaced sense. For instance control signals Az, AZ1 and AZ2 are a first group and the inverted signals are the other group in FIG. 7. No matter how many comparison units are used, a few group of control signals are required. The present invention simplifies circuit layouts and reduces the manufacturing costs.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A data converter for converting an input signal to a plurality of digital bits, the data converter comprising:

n first comparison units for respectively comparing the input signal with n reference signals, each of the comparison units including a positive output end for outputting a first positive output and a negative output end for outputting a first negative output;

n second comparison units for respectively comparing the input signal with the n reference signals, each for outputting a second comparison units including a positive output end for outputting a second positive output and a negative output end for outputting a second negative output; and an output unit electrically connected to the n first comparison units and the n second comparison units for generating digital bits corresponding to the n first comparison units and the n second comparison units, the output unit comprising:

n-1 interpolating units electrically connected to the n first comparison units and the n second comparison units, a $k^{th}$ interpolating unit being electrically connected to a $k^{th}$ and a $k^{th}+1$ first comparison units and a $k^{th}$ and a $k^{th}+1$ second comparison units for adding a third positive output to the first and second positive outputs of the n first comparison units and the n second comparison units and adding a third negative output to the first and second negative outputs of the n first comparison units and the n second comparison units; wherein when the $k^{th}$ and the $k^{th}+1$ first comparison units perform an auto-zeroing process, the $k^{th}$ interpolating unit is capable of utilizing the second positive outputs of the $k^{th}$ and the $k^{th}+1$ second comparison units for generating the third positive output and utilizing the second negative outputs of the $k^{th}$ and the $k^{th}+1$ second comparison units for generating the third negative output;

wherein the output unit generates a digital bit interpolated between a digital bit corresponding to the $k^{th}$ second comparison unit and a digital bit corresponding to the $k^{th}+1$ second comparison unit according to the third positive output and the third negative output in a differential manner.

2. The data converter of claim 1 wherein the output unit further comprises a plurality of latches electrically connected to the first comparison units, the second comparison units, and the interpolating units for outputting the digital bits.

3. The data converter of claim 1 wherein each of the first and second comparison units comprises an amplifier for amplifying a voltage difference between the input signal and a reference signal so as to generate a corresponding positive output and a corresponding negative output.

4. The data converter of claim 3 wherein each of the first and second comparison units further comprises a feedback circuit electrically connected between an output end and an input end of the amplifier, and when the comparison unit performs the auto-zeroing process, the feedback circuit conducts.

5. The data converter of claim 1 wherein the data converter further comprises a voltage dividing circuit for generating the n reference signals.

6. The data converter of claim 1 wherein the third positive output is interpolated between the second positive output of the $k^{th}$ and the $k^{th}+1$ second comparison units, and the third negative output is interpolated between the second negative output of the $k^{th}$ and the $k^{th}+1$ second comparison units.

7. A method for a data converter for converting an input signal to a plurality of digital bits, the data converter comprising:

n first comparison units for respectively comparing the input signal with n reference signals, each of the comparison units including a positive output end for outputting a first positive output and a negative output end for outputting a first negative output, a digital bit corresponding to a first comparison unit being generated from the first positive output and the first negative output in a differential manner;

n second comparison units for respectively comparing the input signal with the n reference signals, each of the second comparison units including a positive output end for outputting a second positive output and a negative output end for outputting a second negative output, a digital bit corresponding to a second comparison unit being generated from the second positive output and the second negative output in a differential manner, the method comprising:

when a $k^{th}$ and a $k^{th}+1$ first comparison units perform an auto-zeroing process, utilizing the second positive outputs of a $k^{th}$ and a $k^{th}+1$ second comparison units for generating a thin positive output, utilizing the second negative outputs of the $k^{th}$ and the $k^{th}+1$ second comparison units for generating a third negative output, and generating a digital bit interpolated between a digital bit corresponding to the $k^{th}$ second comparison unit and a digital bit corresponding to the $k^{th}+1$ second comparison unit according to the third positive output and the third negative output in a differential manner.

8. The method of claim 7 wherein the third positive output is interpolated between the second outputs of the $k^{th}$ and the $k^{th}+1$ second comparison units, and the third negative output is interpolated between the second negative outputs of the $k^{th}$ and the $k^{th}+1$ second comparison units.

9. A data converter for converting an input signal to a plurality of digital bits, the data converter comprising:

n first comparison units tin respectively comparing the input signal with n reference signals, each of the comparison units including a positive output end for outputting a first positive output and a negative output end for outputting a first negative output;

n second comparison units for respectively comparing the input signal with the n reference signals, each of the second comparison units including a positive output end for outputting a second positive output and a negative output end for outputting a second negative output; and an output unit electrically connected to the n first comparison units and the n second comparison units for generating digital bits corresponding to the n first comparison units and the n second comparison units, the output unit comprising:

n-1 interpolating units electrically connected to the n first comparison units and the n second comparison units, a $k^{th}$ interpolating unit being electrically connected to a plurality of ($k^{th}$ to $k^{th}+p$) first comparison units and a plurality of ($k^{th}$ to $k^{th}+p$) second comparison units for adding a plurality of positive outputs to the first and second positive outputs of the n first comparison units and the n second comparison units and adding a plurality of negative outputs to the first and second negative outputs of the n first comparison units and the n first comparison units; wherein p is an integer, and when some first comparison units perform an auto-zeroing process, the $k^{th}$ interpolating unit is capable of utilizing the second positive outputs of the second comparison units for generating a plurality of positive outputs and utilizing the second negative outputs of some second comparison units for generating some negative outputs;

wherein the output unit generates a digital bit interpolated between a digital bit corresponding to the $k^{th}$ second comparison unit and a digital bit corresponding to the $k^{th}$+p second comparison unit according to the positive outputs and the negative outputs in a differential manner.

10. The data converter of claim 9 wherein the output unit further comprises a plurality of latches electrically connected to the first comparison units, the second comparison units, and the interpolating units for outputting the digital bits.

11. The data converter of claim 9 wherein each of the first and second comparison units comprises an amplifier for amplifying a voltage difference between the input signal and a reference signal so as to generate a corresponding positive output and a corresponding negative output.

12. The data converter of claim 11 wherein each of the first and second comparison units further comprises a feedback circuit electrically connected between an output end and an input end of the amplifier, and when the comparison unit performs the auto-zeroing process, the feedback circuit conducts.

13. The data converter of claim 9 wherein each of the positive outputs is interpolated between the second positive outputs of the $k^{th}$ and the $k^{th}$+p second comparison units, and each of the negative output is interpolated between the second negative outputs of the $k^{th}$ and the $k^{th}$+p second comparison units.

* * * * *